(12) United States Patent
Kimura

(10) Patent No.: US 7,579,264 B2
(45) Date of Patent: Aug. 25, 2009

(54) METHOD FOR MANUFACTURING AN ELECTRODE STRUCTURE OF A MOS SEMICONDUCTOR DEVICE

(75) Inventor: Isao Kimura, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 357 days.

(21) Appl. No.: 11/306,386

(22) Filed: Dec. 27, 2005

(65) Prior Publication Data
US 2006/0205153 A1  Sep. 14, 2006

(51) Int. Cl.
*H01L 21/22* (2006.01)
(52) U.S. Cl. .................. 438/549; 438/530
(58) Field of Classification Search .......... 438/233, 438/282, 218, 585, 549
See application file for complete search history.

(56) References Cited

U.S. PATENT DOCUMENTS

| | | | | | |
|---|---|---|---|---|---|
| 5,232,861 | A | * | 8/1993 | Miwa | 438/366 |
| 5,449,637 | A | * | 9/1995 | Saito et al. | 438/227 |
| 5,472,887 | A | * | 12/1995 | Hutter et al. | 438/231 |
| 5,604,143 | A | * | 2/1997 | Ishida et al. | 438/128 |
| 6,165,880 | A | * | 12/2000 | Yaung et al. | 438/592 |
| 6,235,574 | B1 | * | 5/2001 | Tobben et al. | 438/241 |
| 6,309,921 | B1 | * | 10/2001 | Ema et al. | 438/228 |
| 6,511,883 | B1 | * | 1/2003 | Pan et al. | 438/268 |
| 6,946,335 | B1 | * | 9/2005 | Ip et al. | 438/197 |
| 6,972,221 | B2 | * | 12/2005 | Takahashi | 438/166 |
| 7,265,011 | B2 | * | 9/2007 | Yoon et al. | 438/217 |
| 2004/0185611 | A1 | * | 9/2004 | Berthold et al. | 438/200 |
| 2005/0048729 | A1 | * | 3/2005 | Yoon et al. | 438/303 |
| 2006/0014389 | A1 | * | 1/2006 | Osanai | 438/684 |

FOREIGN PATENT DOCUMENTS

JP  4/74426 A  3/1992

* cited by examiner

*Primary Examiner*—Chuong A Luu
*Assistant Examiner*—Ajay K Arora
(74) *Attorney, Agent, or Firm*—Rabin & Berdo, PC.

(57) ABSTRACT

A method for manufacturing a semiconductor device includes the steps of forming a first insulating film over a semiconductor substrate, forming a laminated body on the first insulating film that includes a polysilicon film and a metal film that is separated from the insulating film by means of the polysilicon film, and forming a first wiring layer and a first electrode simultaneously by patterning the laminated body.

12 Claims, 9 Drawing Sheets

METHOD FOR MANUFACTURING AN ELECTRODE STRUCTURE OF A MOS SEMICONDUCTOR DEVICE

BACKGROUND OF THE INVENTION

1. Field of the Invention

The present invention relates to a semiconductor device and a method for manufacturing the same, especially a semiconductor device having a MOS transistor and a method for manufacturing the same.

It has been known that a gate electrode wiring layer and source and drain contact wiring layers in a conventional MOS transistor are comprised of the same material. Japanese Patent No. 2504306 (especially, lines 40-48 in the left column of page 2, and FIG. 1) discloses a conventional example of a semiconductor device in which a gate electrode wiring layer, a source contact wiring layer, and a drain contact wiring layer are comprised of a aluminum layer. In this semiconductor device, a MOS transistor is formed on a silicon active region that is defined by a field oxide film formed through a local oxidation of silicon (LOCOS) process. This transistor includes a gate electrode that is comprised of a single aluminum layer and is also formed on a gate electrode, and source/drain wiring layers comprised of a single aluminum layer to have a contact with source drain regions comprised of a impurity diffusion layer.

The above described conventional MOS transistor has the following problems.

First, the above described conventional MOS transistor includes a gate electrode with a single layer structure of metal. Therefore, the work function (eV) of this gate electrode is lower than that of a gate electrode with a single layer structure of polysilicon. This causes the performance of a conventional MOS transistor to be degraded.

Second, the above described conventional MOS transistor includes source drain contact wiring layers comprised of a single layer structure of metal identical to the gate electrode. That is, a single metal layer that comprises source drain contact layers has a direct contact with source drain regions that is comprised of silicon including impurities. Therefore, degradation of a gate insulating film is caused by deposits included in spikes or metal wirings.

Third, a field oxide film is formed through the LOCOS process in the conventional method for manufacturing a semiconductor device. Therefore, a number of processes are needed in order to form a mask that is comprised of a resist pattern.

In view of the above, it will be apparent to those skilled in the art from this disclosure that there exists a need for an improved semiconductor device and an improved method for manufacturing a semiconductor device. This invention addresses these needs in the art as well as other needs, which will become apparent to those skilled in the art from this disclosure.

SUMMARY OF THE INVENTION

It is therefore an objective of the present invention to resolve the above-described problems and to provide a semiconductor device including a gate insulating film, which is not deteriorated by deposits included in spikes or metal wirings, and a gate electrode with the high work function. In addition to this, it is an also objective to provide a method for manufacturing a semiconductor device with fewer processes for forming a resist mask.

In accordance with the present invention, a method for manufacturing a semiconductor device is comprised of the steps of forming a first insulating film over a semiconductor substrate, forming a laminated body on the first insulating film that includes a polysilicon film and a metal film that is separated from the insulating film by means of the polysilicon film, and forming a first wiring layer and a first electrode simultaneously by patterning the laminated body.

Furthermore, in accordance with the present invention, a semiconductor device is comprised of a semiconductor substrate, a first insulating film formed over the semiconductor substrate, a first electrode that is formed on the first insulating film and is comprised of a first polysilicon film and a first metal film that is separated from the first insulating film by means of the first polysilicon film, and a first wiring layer comprised of a second polysilicon film that is formed on the first insulating film and is comprised of the same material of the first polysilicon film, and a second metal film that is separated from the first insulating film by means of the second polysilicon film and is comprised of the same material of the first metal film.

Also, in the semiconductor device, the first polysilicon film and the second polysilicon film are formed with substantially the same thickness.

Also, in the semiconductor device, the semiconductor substrate further includes a first region; and the second metal film has an electrical connection with the first region through a contact hole that has a contact with the first region through the second polysilicon film and the first insulating film. Furthermore, in this semiconductor device, the first region is comprised of either or both of a source region and a drain region.

Also, in the semiconductor device, the semiconductor substrate further includes a channel stopper.

Also in the semiconductor device, the first insulating film is a gate insulating film.

Also, in the semiconductor device, the first electrode is a gate electrode.

Also, in the semiconductor device, the first electrode is a floating gate electrode.

Also, in the semiconductor device, the semiconductor device includes a field-effect transistor.

According to the semiconductor device of the present invention, the polysilicon layer is formed on the insulating film that is formed over the semiconductor substrate, and the metal film is formed on the polysilicon film. Thus, a laminated body that is comprised of the polysilicon film and the metal film is formed. Then, the electrode and the wiring layer are simultaneously formed by patterning the laminated body. Therefore, the present invention has the following effects.

First, the semiconductor device of the present invention includes a polysilicon film, a wiring film with a dual layer structure of a polysilicon film and a metal film, and an electrode with the dual layer structure identical to that of the wiring layer. Therefore, the electrode with a dual layer structure of a polysilicon film and a metal film has a higher work function compared to an electrode with a single layer structure of metal. This enables the semiconductor device to have a desired high performance and to maintain a desired reliability.

Second, the wiring film is formed with the dual layer structure of the polysilicon film and the metal film. Here, the polysilicon film has a direct contact with the insulating film. On the other hand, the metal film is separated from the insulating film across the polysilicon film. Because of this, degradation of the insulating film is not caused by deposits included in spikes or metal wirings.

Third, the wiring layer and the electrode are formed in the same step in the method for manufacturing a semiconductor device in accordance with the present invention. Therefore, the number of steps of forming a mask comprised of a resist pattern in the present invention is fewer than when forming a wiring layer and an electrode in different steps.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1A:
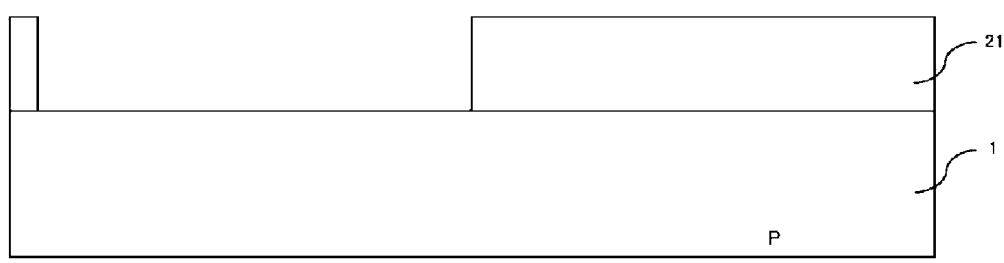
FIGS. 1A to 1C are partial cross-section diagrams showing manufacturing processes of a high voltage semiconductor device in accordance with the first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

The present embodiment provides a high voltage semiconductor device with a n-channel MOS transistor and a p-channel MOS transistor and a method for manufacturing thereof.

The High Voltage Semiconductor Structure

Figure 9A:
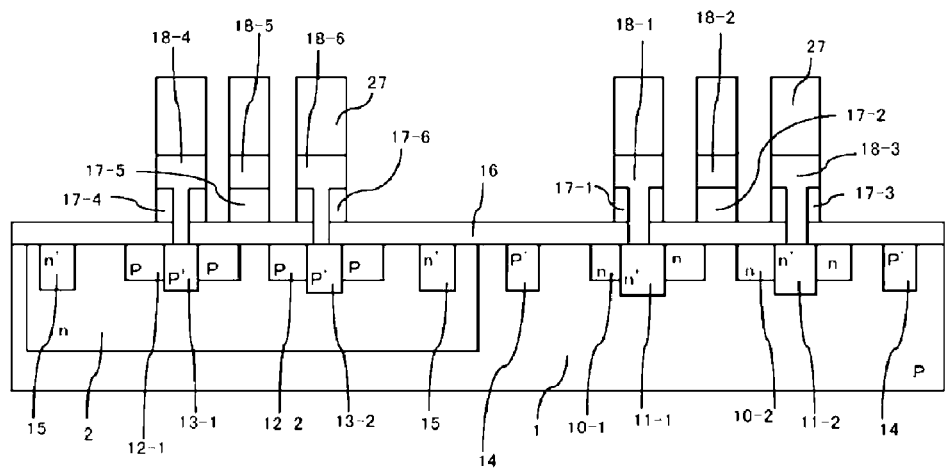
FIGS. 9A to 9C are partial cross-section diagrams showing manufacturing processes of a high voltage semiconductor device in accordance with the first embodiment of the present invention.
Figure 9B:
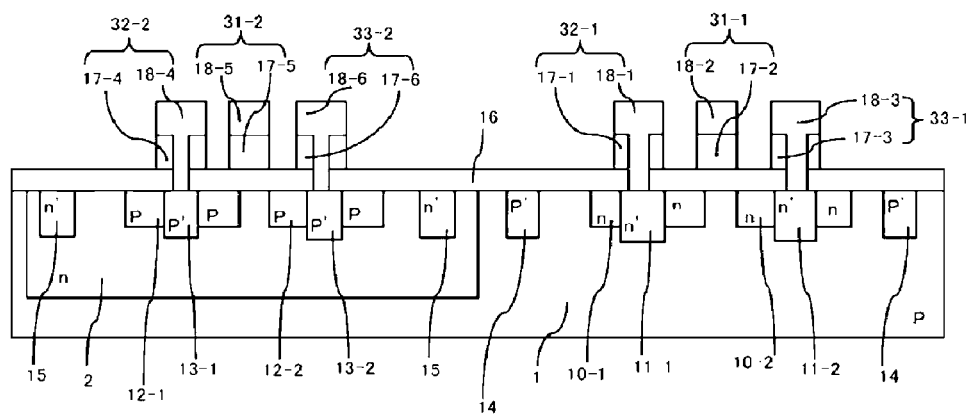
Figure 9C:
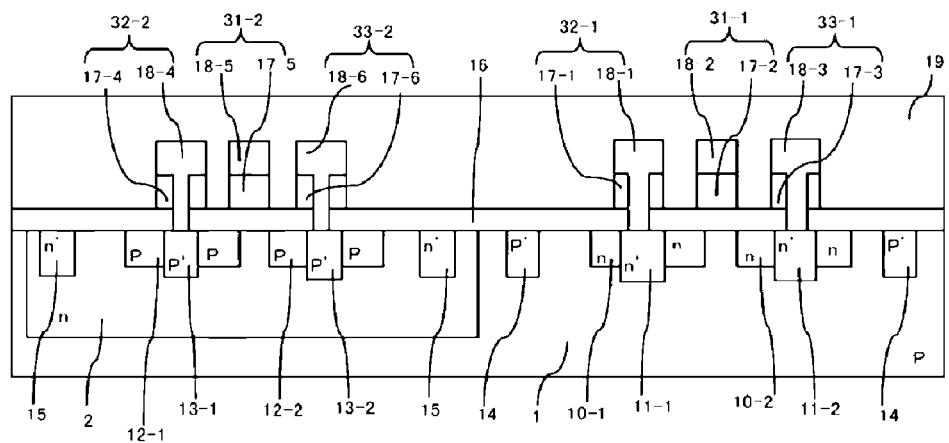

FIG. 9C is a partial cross-section diagram showing a structure of a high voltage semiconductor device in accordance with the first embodiment of the present invention.

The high voltage semiconductor device in accordance with the present embodiment has the following structure.

A p-type single crystal silicon substrate 1 has a n-type well 2. A p-type channel stopper 14, which delimits a p-type active region, is formed in an upper region of the p-type single crystal silicon substrate 1. A n-type channel stopper 15, which delimits a n-type active region, is formed in an upper region of the n-type well 2. A n-channel MOS transistor is formed on the p-type active region. A p-channel MOS transistor is formed on the n-type active region.

A n-channel MOS transistor is comprised of a n-type source region, a n-type drain region, a n-channel region that is delimited between the n-type source region and the n-type drain region, a first gate electrode 31-1 that is formed on a gate oxide film 16 and is also located above the n-channel region, a first source contact wiring layer 32-1 that is in contact with the n-type source region, and a first drain contact wiring layer 33-1 that is in contact with the n-type drain region. The n-type source region is comprised of a first N− low concentration diffusion region 10-1 and a first N+ high concentration diffusion region 11-1. The n-type drain region is comprised of a second N− low concentration diffusion region 10-2 and a second N+ high concentration diffusion region 11-2. The first source contact wiring layer 32-1 is comprised of a first polysilicon layer 17-1 and a first metal layer 18-1. The first drain contact wiring layer 33-1 is comprised of a third polysilicon layer 17-3 and a third metal layer 18-3. The first gate electrode 31-1 is comprised of a laminated structure body of a second polysilicon layer 17-2 and a second metal layer 18-2.

A p-channel MOS transistor is comprised of a p-type source region, a p-type drain region, a p-channel region that is delaminated between the p-type source region and the p-type drain region, a second gate electrode 31-2 that is formed on the gate oxide film 16 and is also located above the p-channel region, a second source contact wiring layer 32-2 that is in contact with the p-type source region, and a second drain contact wiring layer 33-2 that is in contact with the p-type drain region. The p-type source region is comprised of a first P− low concentration diffusion region 12-1 and a first P+ high concentration diffusion region 13-1. The p-type drain region is comprised of a second P− low concentration diffusion region 12-2 and a second P+ high concentration diffusion region 13-2. The second source contact wiring layer 32-2 is comprised of a fourth polysilicon layer 17-4 and a fourth metal layer 18-4. The second drain contact wiring layer 33-2 is comprised of a sixth polysilicon layer 17-6 and a sixth metal layer 18-6. The second gate electrode 31-2 is comprised of a laminated structure body of a fifth polysilicon layer 17-5 and a fifth metal layer 18-5.

Specifically, the first source contact wiring layer 32-1, which is comprised of the first laminated structure body of the first polysilicon layer 17-1 and the first metal layer 18-1, is formed over the first N+ high concentration diffusion region 11-1. The first gate electrode 31-1, which is comprised of the second laminated structure body of the second polysilicon layer 17-2 and the second metal layer 18-2 is formed over the n-channel region. The first drain contact wiring layer 33-1, which is comprised of the third laminated structure body of the third polysilicon layer 17-3 and the third metal layer 18-3 is formed over the second N+ high concentration diffusion region 11-2. Furthermore, the second source contact wiring layer 32-2, which is comprised of the fourth laminated structure body of the fourth polysilicon layer 17-4 and the fourth metal layer 18-4, is formed over the first P+ high concentration diffusion region 13-1. The second gate electrode 31-2, which is comprised of the fifth laminated structure body of the fifth polysilicon layer 17-5 and the fifth metal layer 18-5, is formed over the p-channel region that is delimited between the first P− low concentration diffusion region 12-1 and the second P− low concentration diffusion region 12-2. The second drain contact wiring layer 33-2, which is comprised of the sixth laminated structure body of the sixth polysilicon layer 17-6 and the sixth metal layer 18-6 is formed over the second P+ high concentration diffusion region 13-2

When the structure of the high voltage semiconductor device in accordance with the first embodiment of the present invention is seen in a plan view, the first gate electrode 31-1 overlaps with the first N− low concentration diffusion region 10-1 and the second N− low concentration diffusion region 10-2, not with the first N+ high concentration diffusion region 11-1 and the second N+ high concentration diffusion region 11-2. By the same token, the second gate electrode 31-2 overlaps with the first P− low concentration diffusion region 12-1 and the second P− low concentration diffusion region 12-2, but not with the first P+ high concentration diffusion region 13-1 and the second P+ high concentration diffusion region 13-2. This overlap structure alleviates the field effect.

The first gate electrode 31-1, the first source contact wiring layer 32-1, the first drain contact wiring layer 33-1, a second gate electrode 31-2, the second source contact wiring layer 32-2, and the second drain contact wiring layer 33-2 are simultaneously formed by patterning a laminated body of a polysilicon film 17 and a metal film 18. Therefore, the first gate electrode 31-1, the second gate electrode 31-2, the first source contact wiring layer 32-1, the first drain contact wiring layer 33-1, the second source contact wiring layer 32-2, and the second drain contact wiring layer 33-2 have the same laminated structure. Here, thickness of the first to sixth polysilicon layers 17-1 to 17-6 are substantially the same. Furthermore, thickness of the first to sixth metal layers 18-1 to 18-6 are substantially the same.

With reference to the attached figures, a method for manufacturing a high voltage semiconductor device in accordance with the first embodiment of the present invention is hereinafter explained.

FIGS. 1A to 1C, 2A to 2C, 3A to 3C, 4A to 4C, 5A to 5C, 6A to 6C, 7A to 7C, 8A to 8C, 9A to 9C are partial cross-section diagrams to show manufacturing processes of the high voltage semiconductor device in accordance with the first embodiment of the present invention.

As shown in FIG. 1A, a resist pattern 21 is formed on a p-type single crystal silicon substrate 1 with heretofore known photolithography technology.

Figure 1B:
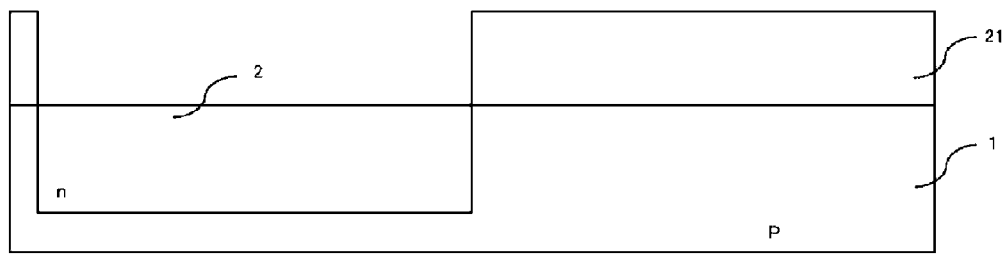

As shown in FIG. 1B, the n-type impurity, phosphorus (P) is selectively implanted into the p-type single crystal silicon substrate 1 by using the resist pattern 21 as a mask. This process is conducted in the following condition. That is, the acceleration energy is set to be 150 keV, and the dose amount is set to be $3.0 \times 10^{12}$ cm$^{-2}$ to $5.0 \times 10^{12}$ cm$^{-2}$. Then, the thermal treatment is conducted at 1070 degrees Celsius for 500 minutes. Because of this, thermal diffusion of the implanted n-type impurity is caused, and a n-type well 2 of 6 to 7 μm in depth is selectively formed in the p-type single crystal silicon substrate 1.

Figure 1C:
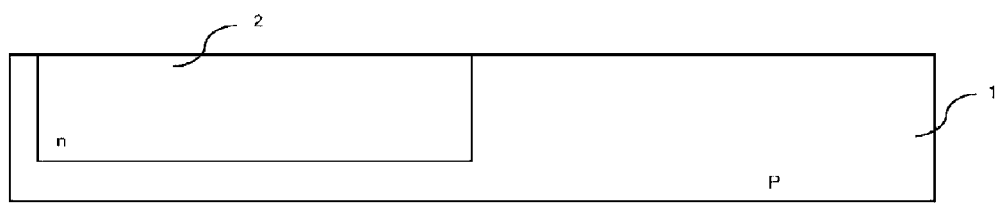

Next, as shown in FIG. 1C, the resist pattern 21 is eliminated with a heretofore known method.

Figure 2A:
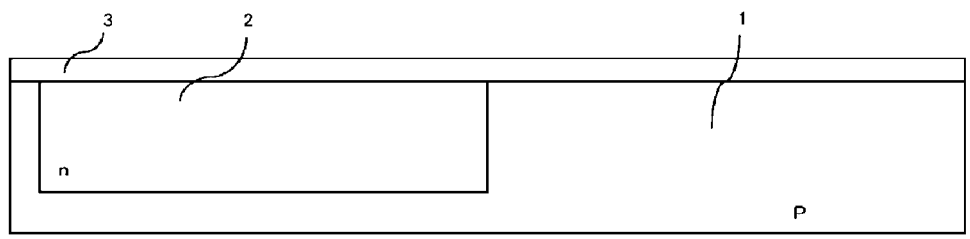
FIGS. 2A to 2C are partial cross-section diagrams showing manufacturing processes of a high voltage semiconductor device in accordance with the first embodiment of the present invention.

Next, as shown in FIG. 2A, surfaces of the p-type single crystal silicon substrate 1 and the n-type well 2 are thermally oxidized with a heretofore known thermal oxidation process. Thus, a silicon dioxide film 3 of 500 Å in thickness is formed on both the p-type single crystal silicon substrate 1 and the n-type well 2.

Figure 2B:
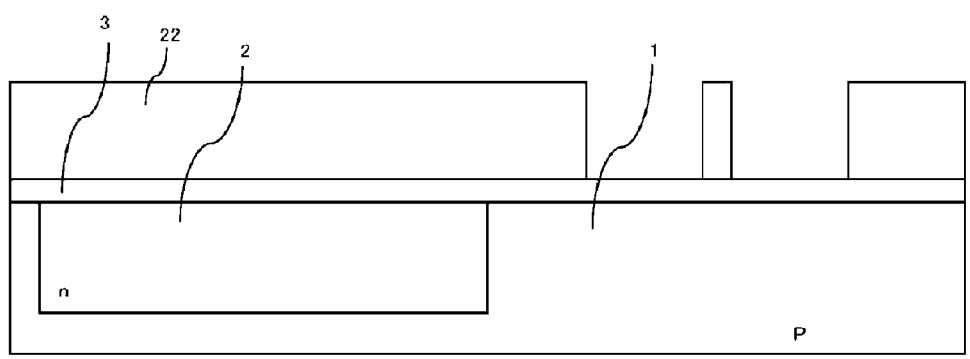

As shown in FIG. 2B, a resist pattern 22 is formed on the silicon dioxide film 3 with a heretofore known photolithography technique.

Figure 2C:
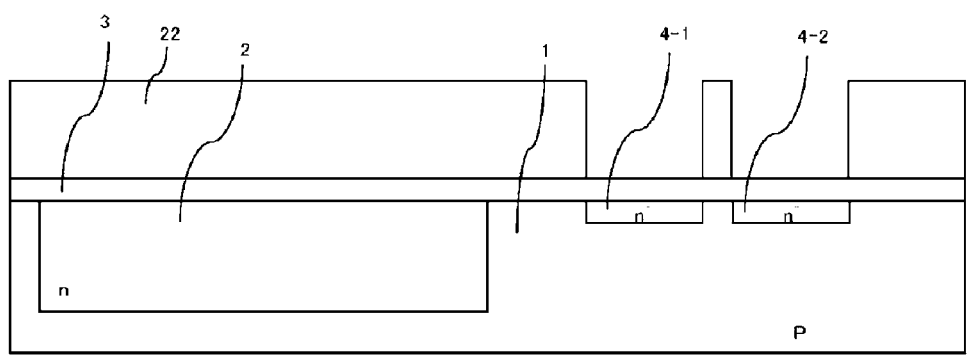

As shown in FIG. 2C, the n-type impurity, phosphorus (P) is selectively implanted into the p-type single crystal silicon substrate 1 through the silicon dioxide film 3 by using the resist pattern 22 as a mask. This process is conducted in the following condition. That is, the acceleration energy is set to be 60 keV, and the dose amount is set to be $1.0 \times 10^{13}$ cm$^{-2}$. Thus, a first N− low concentration impurity implantation region 4-1 and a second N− low concentration impurity implantation region 4-2 are selectively formed in the p-type single crystal silicon substrate 1. The first N− low concentration impurity implantation region 4-1 and the second N− low concentration impurity implantation region 4-2 are separated across a portion of the p-type single crystal silicon substrate 1, and they are also separated from the n-type well 2.

Figure 3A:
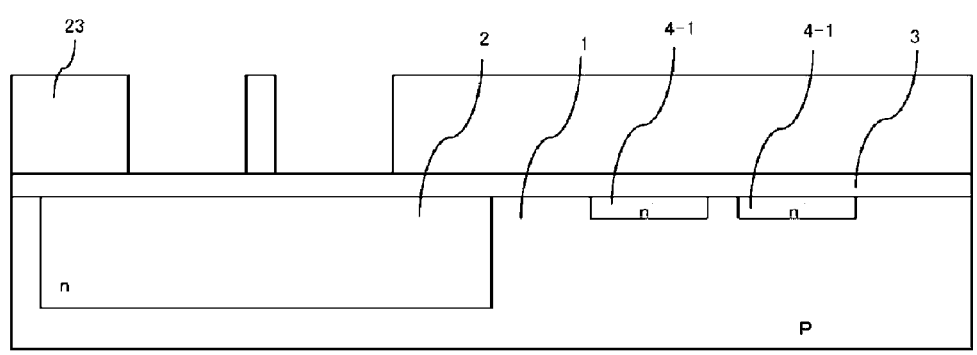
FIGS. 3A to 3C are partial cross-section diagrams showing manufacturing processes of a high voltage semiconductor device in accordance with the first embodiment of the present invention.

As shown in FIG. 3A, the resist pattern 22 is eliminated with a heretofore known method. Then, a resist pattern 23 is formed on the silicon dioxide film 3 with a heretofore known photolithography technique.

Figure 3B:
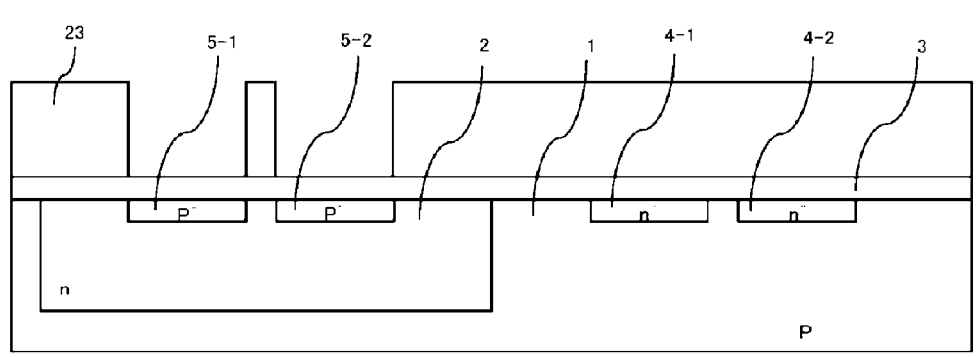

As shown in FIG. 3B, the p-type impurity, boron (B) or boron difluoride (BF$_2$) is selectively implanted into the n-type well 2 through the silicon dioxide film 3 by using the resist pattern 23 as a mask. This process is conducted in the following condition. That is, the acceleration energy is set to be 70 keV, and the dose amount is set to be $1.0 \times 10^{13}$ cm$^{-2}$. Thus, a first P− low concentration impurity implantation region 5-1 and a second P− low concentration impurity implantation region 5-2 are selectively formed in the n-type well 2. The first P− low concentration impurity implantation region 5-1 and the second P− low concentration impurity implantation region 5-2 are separated across a portion of the n-type well 2, and they are also separated from the p-type single crystal silicon substrate 1.

Figure 3C:
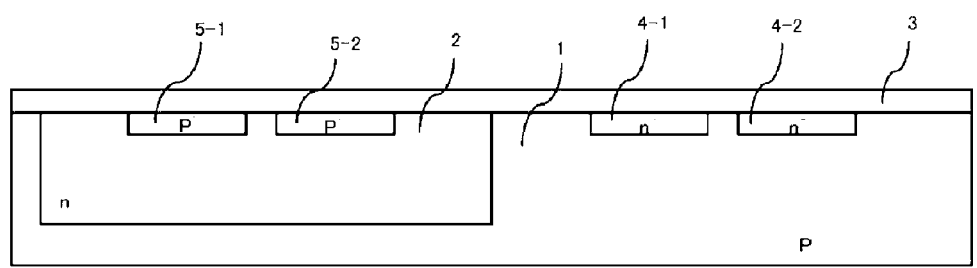

As shown in FIG. 3C, the resist pattern 23 is eliminated with a heretofore known method.

Figure 4A:
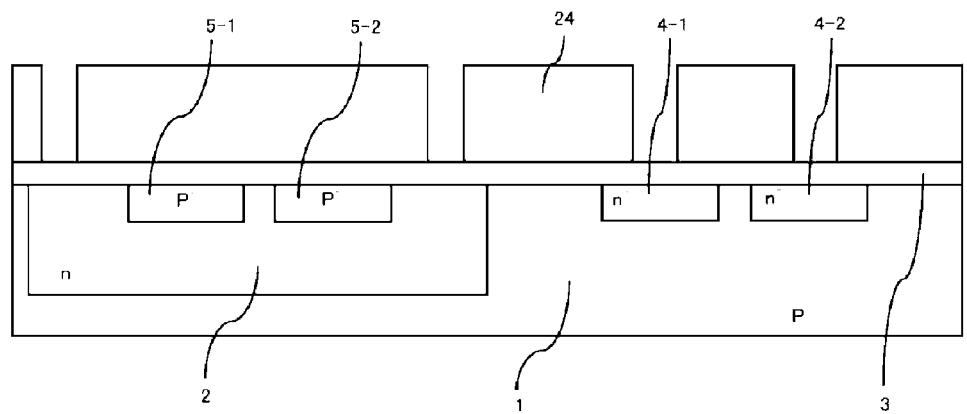
FIGS. 4A to 4C are partial cross-section diagrams showing manufacturing processes of a high voltage semiconductor device in accordance with the first embodiment of the present invention.

As shown in FIG. 4A, a resist pattern 24 is formed on the silicon dioxide film 3 with a heretofore known photolithography technique.

Figure 4B:
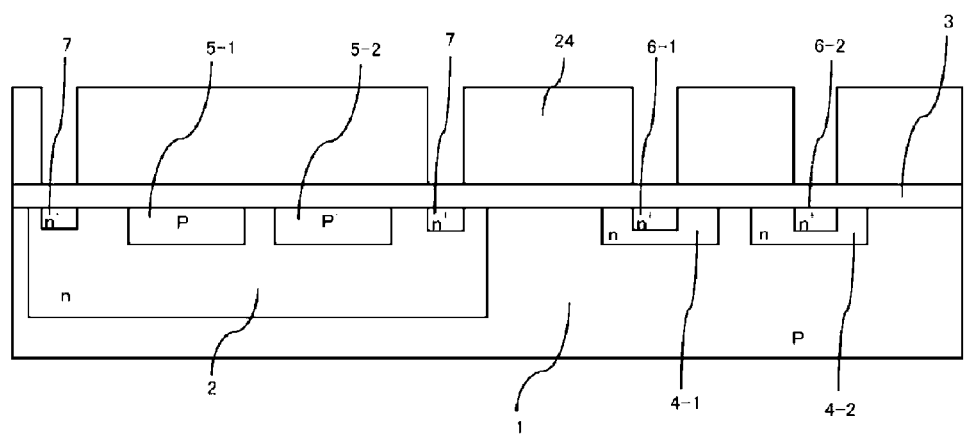

As shown in FIG. 4B, the n-type impurity, phosphorus (P) is selectively implanted into the first N− low concentration impurity implantation region 4-1, the second N− low concentration impurity implantation region 4-2, and the n-type well 2 through the silicon dioxide film 3 by using the resist pattern 24 as a mask. This process is conducted in the following condition. That is, the acceleration energy is set to be 30 to 50 keV, and the dose amount is set to be $1.0 \times 10^{15}$ cm$^{-2}$. Thus, a first N+ high concentration impurity implantation region 6-1 and a second N+ high concentration impurity implantation region 6-2 are selectively formed in the first N− low concentration impurity implantation region 4-1, the second N− low concentration impurity implantation region 4-2, respectively, and a third N+ high concentration impurity implantation region 7 is selectively formed in the n-type well 2. The first N+ high concentration impurity implantation region 6-1 and the second N+ high concentration impurity implantation region 6-2 are both separated from the p-type single crystal silicon substrate 1 across the first N− low concentration impurity implantation region 4-1 and the second N− low concentration impurity implantation region 4-2, respectively. When the third N+ high concentration impurity implantation region 7 is seen in a plan view, it is formed in a shape of rectangular loop so that it surrounds the first P− low concentration impurity implantation region 5-1 and the second P− low concentration impurity implantation region 5-2. The third N+ high concentration impurity implantation region 7 is separated from the first P− low concentration impurity implantation region 5-1, the second P− low concentration impurity implantation region 5-2, and the n-type single crystal silicon substrate 1 across the n-type well 2.

Figure 4C:
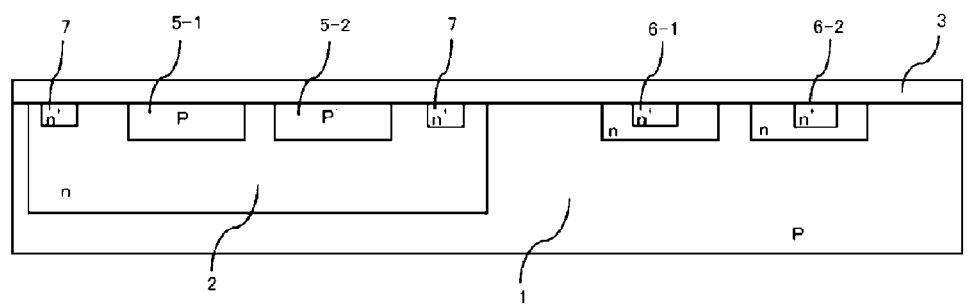

As shown in FIG. 4C, the resist pattern 24 is eliminated with a heretofore known method.

Figure 5A:
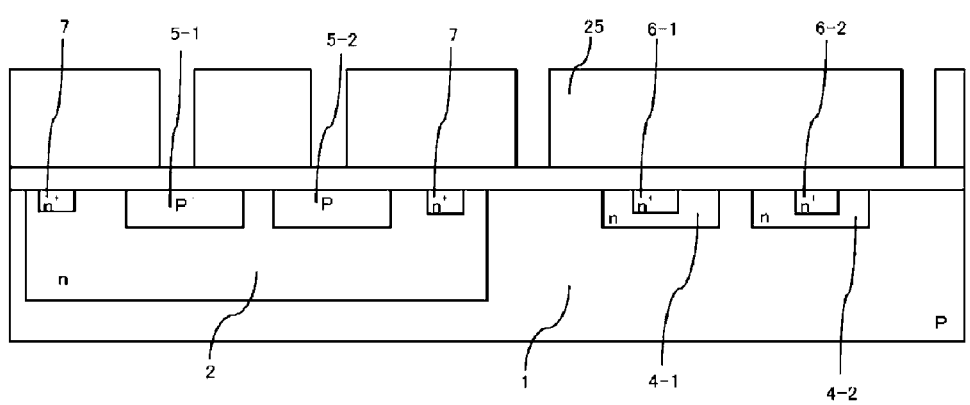
FIGS. 5A to 5C are partial cross-section diagrams showing manufacturing processes of a high voltage semiconductor device in accordance with the first embodiment of the present invention.

As shown in FIG. 5A, a resist pattern 25 is formed on the silicon dioxide film 3 with a heretofore known photolithography.

Figure 5B:
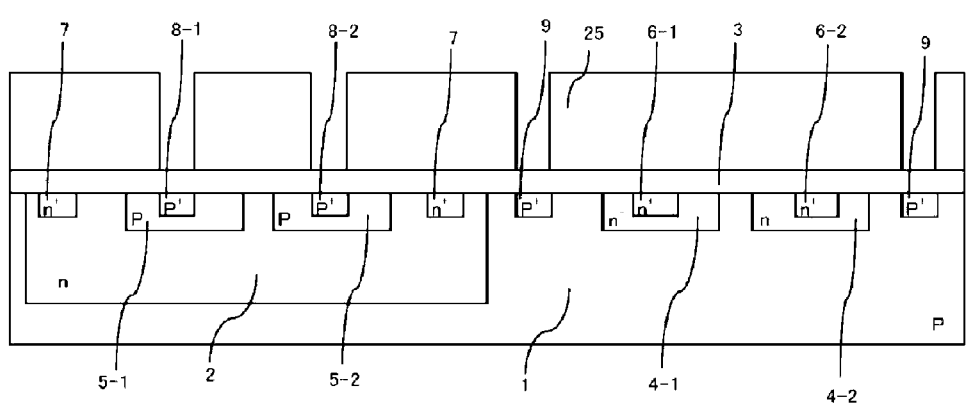

As shown in FIG. 5B, the p-type impurity, boron (B) or boron difluoride ($BF_2$) is selectively implanted into the first P− low concentration impurity implantation region 5-1, the second P− low concentration impurity implantation region 5-2, and the p-type single crystal silicon substrate 1 through the silicon dioxide film 3 by using the resist pattern 25 as a mask. This process is conducted in the following conditions. That is, the acceleration energy is set to be 40 to 50 keV, and the dose amount is set to be $1.0 \times 10^{15}$ $cm^{-2}$. Thus, a first P+ high concentration impurity implantation region 8-1 and a second P+ high concentration impurity implantation region 8-2 are selectively formed in the first P− low concentration impurity implantation region 5-1 and the second P− low concentration impurity implantation region 5-2, respectively. Also, a third P+ high concentration impurity implantation region 9 is electively formed in the p-type single crystal silicon substrate 1 at the same time. The first P+ high concentration impurity implantation region 8-1 and the second P+ high concentration impurity implantation region 8-2 are separated from the n-type well 2 across the first P− low concentration impurity implantation region 5-1 and the second P− low concentration impurity implantation region 5-2, respectively. When the third P+ high concentration impurity implantation region 9 is seen in a plan view, it is formed in a shape of rectangular loop in order to surround the first N− low concentration impurity implantation region 4-1 and the second N− low concentration impurity implantation region 4-2. The third P+ high concentration impurity implantation region 9 is separated from the first N− low concentration impurity implantation region 4-1 and the second N− low concentration impurity implantation region 4-2, and the n-type well 2 across p-type single critical silicon substrate 1.

Figure 5C:
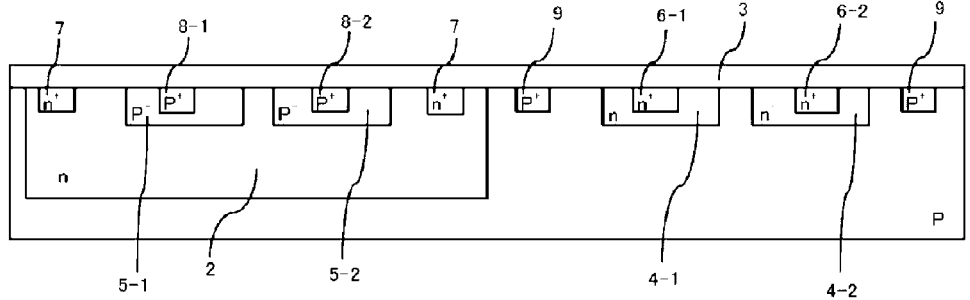

As shown in FIG. 5C, the resist pattern 25 is eliminated with a heretofore known method.

Figure 6A:
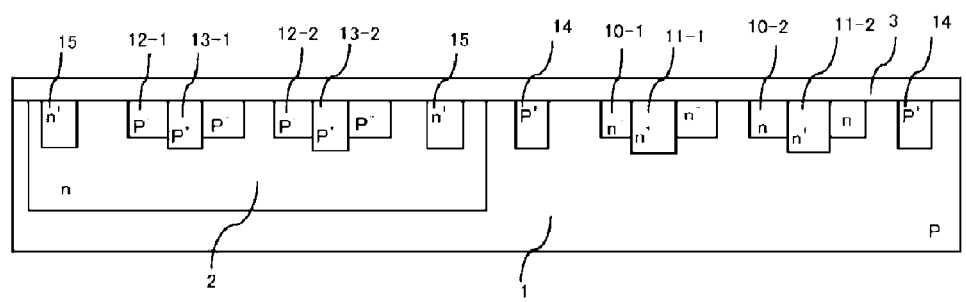
FIGS. 6A to 6C are partial cross-section diagrams showing manufacturing processes of a high voltage semiconductor device in accordance with the first embodiment of the present invention.

As shown in FIG. 6A, the thermal diffusion process at 1000 degrees Celsius for 200 minutes is simultaneously conducted for the n-type impurities in the first N− low concentration impurity implantation region 4-1 and the second N− low concentration impurity implantation region 4-2, the n-type impurities in the first N+ high concentration impurity implantation region 6-1 and the second N+ high concentration impurity implantation region 6-2, the n-type impurity in the third N+ high concentration impurity implantation region 7, the p-type impurities in the first P− low concentration impurity implantation region 5-1 and the second P− low concentration impurity implantation region 5-2, the p-type impurities in the first P+ high concentration impurity implantation region 8-1 and the second P+ high concentration impurity implantation region 8-2, and the p-type impurity in third P+ high concentration impurity implantation region 9.

Through the thermal diffusion process, the first N− low concentration impurity implantation region 4-1 and the first N+ high concentration impurity implantation region 6-1 are changed into a first N− low concentration diffusion region 10-1 and a first N+ high concentration diffusion region 11-1, respectively. Also, through the thermal diffusion process, the second N− low concentration impurity implantation region 4-2 and the second N+ high concentration impurity implantation region 6-2 are changed into a second N− low concentration diffusion region 10-2 and a second N+ high concentration diffusion region 11-2, respectively. Also, through the thermal diffusion process, the first P− low concentration impurity implantation region 5-1 and the first P+ high concentration impurity implantation region 8-1 are changed into a first P− low concentration diffusion region 12-1 and a first P+ high concentration diffusion region 13-1, respectively. Also, through the thermal diffusion process, the second P− low concentration impurity implantation region 5-2 and the second P+ high concentration impurity implantation region 8-2 are changed into a second P− low concentration diffusion region 12-2 and a second P+ high concentration diffusion region 13-2, respectively. Also, through the thermal diffusion process, the third P+ high concentration impurity implantation region 9 is changed into a p-type channel stopper 14, and the third N+ high concentration impurity implantation region 7 is changed into a n-type channel stopper 15.

Depth of the thermally oxidized impurity depends on the impurity concentration in the impurity implantation region before the thermal oxidation process is conducted. Therefore, depths of the first N+ high concentration diffusion region 11-1 and the second N+ high concentration diffusion region 11-2 are deeper than those of the first N− low concentration diffusion region 10-1 and the second N− low concentration diffusion region 10-2. Also, depths of the first P+ high concentration diffusion region 13-1 and the second P+ high concentration diffusion region 13-2 are deeper than those of the first P− low concentration diffusion region 12-1 and the second P− low concentration diffusion region 12-2, respectively.

Here, the p-type channel stopper 14 is comprised of a P+ high concentration diffusion region whose impurity concentration is greater than that of the p-type single crystal silicon substrate 1. The n-type channel stopper 15 is comprised of a N+ high concentration diffusion region whose impurity concentration is greater than that of the n-type well 2. A n-type source region is comprised of the first N− low concentration diffusion region 10-1 and the first N+ high concentration diffusion region 11-1. A n-type drain region is comprised of the second N− low concentration diffusion region 10-2 and the second N+ high concentration diffusion region 11-2. A p-type source region is comprised of the first P− low concentration diffusion region 12-1 and the first P+ high concentration diffusion region 13-1. A p-type drain region is comprised of the second P− low concentration diffusion region 12-2 and the second P+ high concentration diffusion region 13-2. In other words, the n-type source region and the n-type drain region are formed in the p-type single crystal silicon substrate 1. On the other hand, the p-type source region and the p-type drain region are formed in the n-type well 2. Length of the n-type channel is defined by the distance between the n-type source region and the n-type drain region. Length of the p-type channel is defined by the distance between the p-type source region and the p-type drain region. When the p-type channel stopper 14 is seen in a plan view, it is formed in an upper region of the p-type single crystal silicon substrate 1 in a shape of the rectangular loop to surround the n-type source region and the n-type drain region. Also, when the n-type channel stopper 15 is seen in a plan view, it is formed in an upper region of the n-type well 2 in a shape of the rectangular loop to surround the p-type source region and the p-type drain region.

Figure 6B:
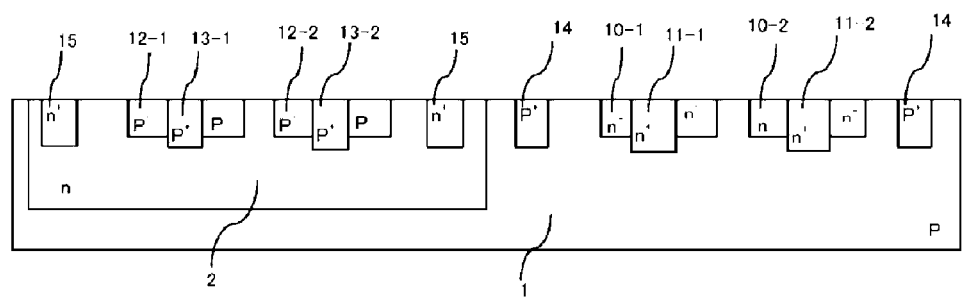

As described above, impurities have penetrated the silicon dioxide film 3 through the plural ion implantation processes as above described. Because of this, the silicon dioxide film 3 has been damaged. Therefore, as shown in FIG. 6B, the silicon dioxide film 3 is eliminated with a heretofore known method. As a result, surfaces of the n-type source region, the n-type drain region, the p-type source region, the p-type drain region, the p-type crystal single silicon substrate 1, and the n-type well 2 are exposed.

Figure 6C:
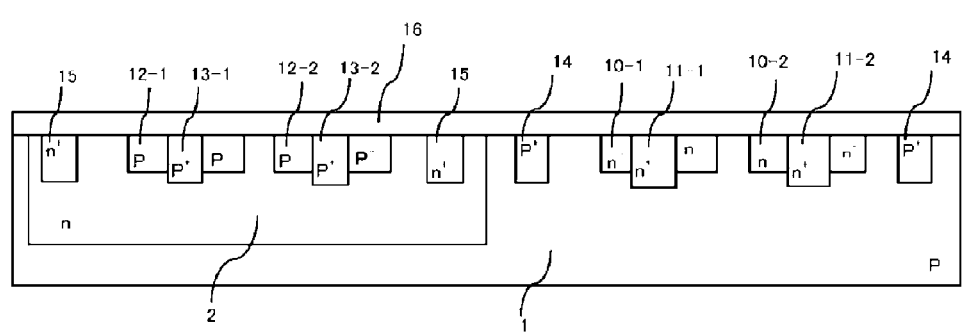

As shown in FIG. 6C, a gate insulating film 16 of 1000 Å in thickness is formed on those described exposed surfaces with a heretofore known oxidization technique. The gate insulating film 16 can be comprised of a silicon dioxide film or a silicon oxide nitride film.

Figure 7A:
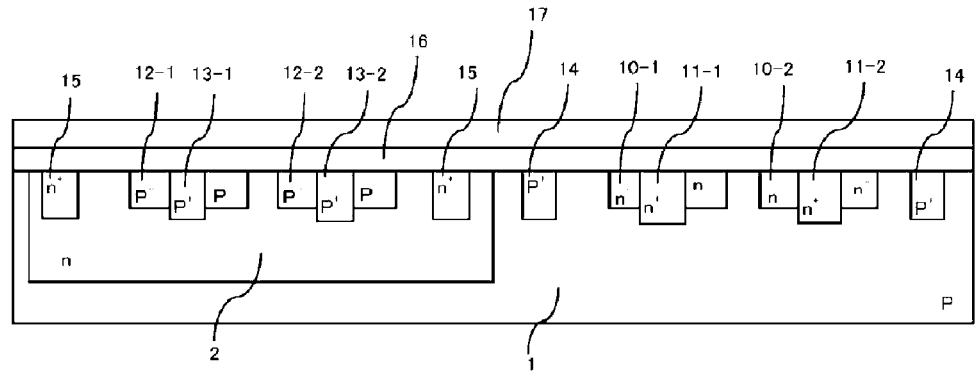
FIGS. 7A to 7C are partial cross-section diagrams showing manufacturing processes of a high voltage semiconductor device in accordance with the first embodiment of the present invention.

As shown in FIG. 7A, a polysilicon film 17 of 2000 Å in thickness is formed on the gate insulating film 16 with a chemical Vapor Deposition (CVD) method. A laminated body is comprised of the gate insulating film 16 and the polysilicon film 17.

Figure 7B:
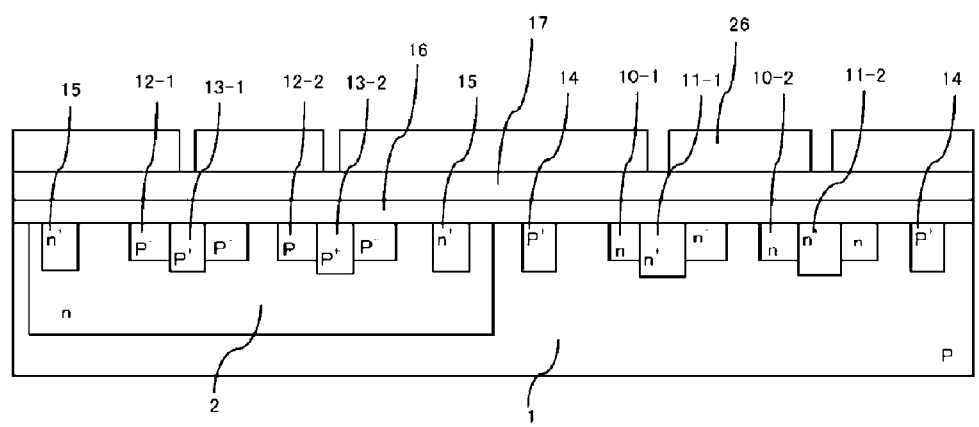

As shown in FIG. 7B, a resist pattern 26 is formed on the gate insulating film 16 with a heretofore known photolithography technique.

Figure 7C:
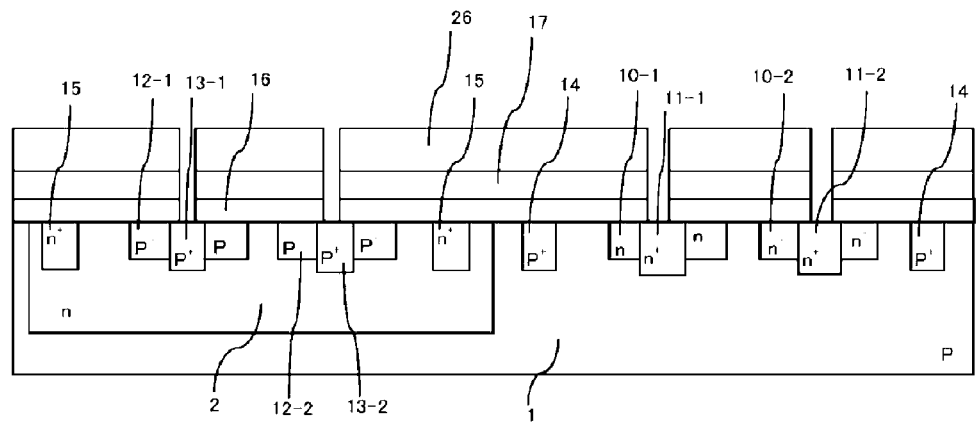

As shown in FIG. 7C, contact holes are formed in the above described laminated body that is comprised of the gate insulating film 16 and the polysilicon film 17 by selectively etching this laminated body by using the resist pattern 26 as a mask with a heretofore known anisotropic etching technique. As a result, a portion of the surface of the first N+ high concentration diffusion region 11-1, the second N+ high concentration diffusion region 11-2, the first P+ high concentration diffusion region 13-1, and the second P+ high concentration diffusion region 13-2, respectively, are exposed through these contact holes. As a typical example, the diameter of each contact hole may be set to be 0.7 μm. On the other hand, the thickness of the above described laminated body is set to be 3000 Å. Therefore, the aspect ratio of each contact hole is quite small.

Figure 8A:
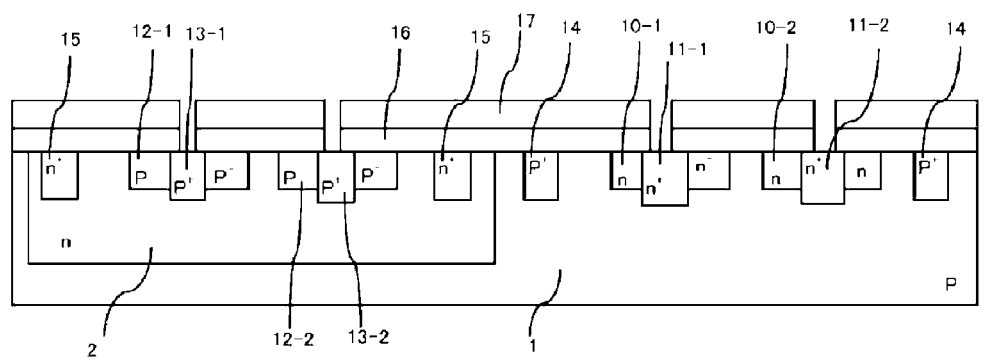
FIGS. 8A to 8C are partial cross-section diagrams showing manufacturing processes of a high voltage semiconductor device in accordance with the first embodiment of the present invention.

As shown in FIG. 8A, the resist pattern 26 is eliminated with a heretofore known method.

Figure 8B:
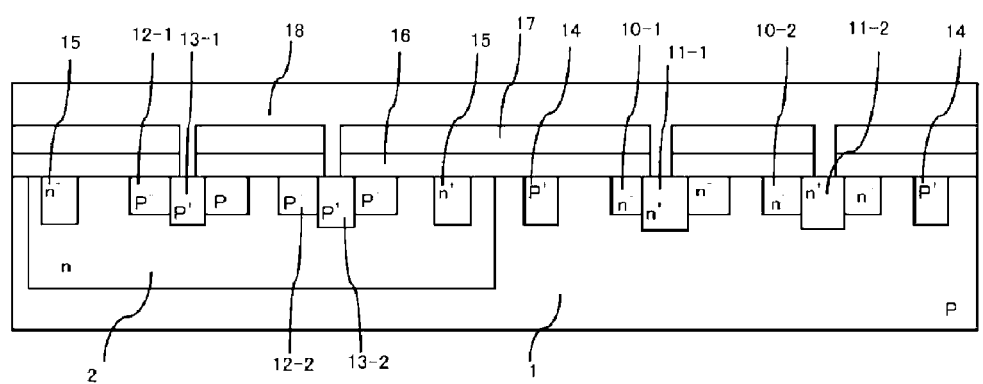

As shown in FIG. 8B, a metal film 18 is formed on the polysilicon film 17 and in the interior of each contact hole with a heretofore known sputtering technique. Thus, a laminated body comprised of the polysilicon film 17 and the metal film 18 is formed. As described above, the aspect ratio of each contact hole is quite small. Therefore, this enables each contact hole to be fully filled with the metal film 18 without forming voids, and also enables the surface of the metal film 18 to be formed in a nearly flat shape. The metal film 18 is in contact with a portion of the surface of the first N+ high concentration diffusion region 11-1, the second N+ high concentration diffusion region 11-2, the first P+ high concentration diffusion region 13-1, and the second P+ high concentration diffusion region 13-2, respectively, through the contact hole. As a typical example, this metal film 18 can be comprised of an aluminum film. Also, this metal film 18 may be comprised of a copper film.

Figure 8C:
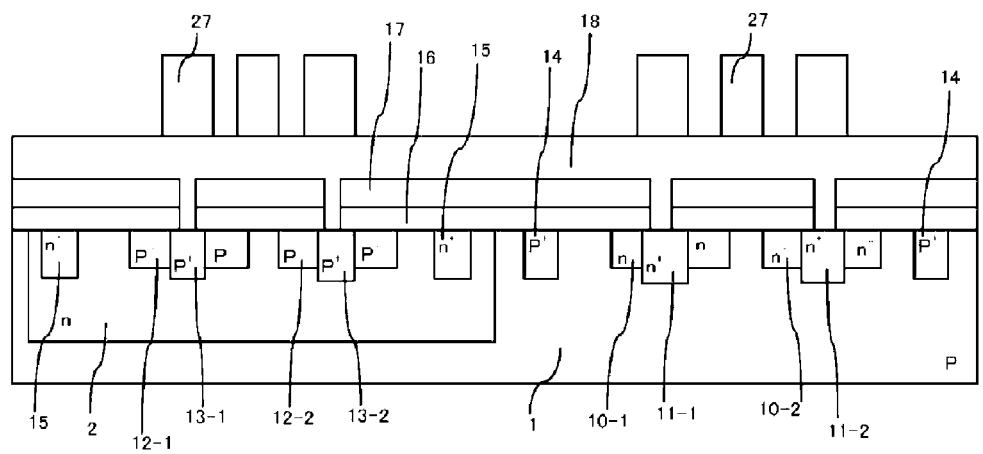

As shown in FIG. 8C, a resist pattern 27 is formed on the metal film 18 with a heretofore known photolithography technique.

As shown in FIG. 9A, a laminated structure body comprised of the polysilicon film 17 and the metal film 18 is selectively etched by using the resist pattern 27 as a mask with a heretofore known etching technique. As a result, a first laminated structure body comprised of a first polysilicon layer 17-1 and a first metal layer 18-1 is formed over the first N+ high concentration diffusion region 11-1. A second laminated structure body comprised of a second polysilicon layer 17-2 and a second metal layer 18-2 is formed over the n-channel region that is delimited between the first N− low concentration diffusion region 10-1 and the second N− low concentration diffusion region 10-2. A third laminated structure body comprised of a third polysilicon layer 17-3 and a third metal layer 18-3 is formed over the second N+ high concentration diffusion region 11-2. Furthermore, a fourth laminated structure body comprised of a fourth polysilicon layer 17-4 and a fourth metal layer 18-4 is formed over the first P+ high concentration diffusion region 13-1. A fifth laminated structure body comprised of a fifth polysilicon layer 17-5 and a fifth metal layer 18-5 is formed over a p-channel region that is delimited between the first P− low concentration diffusion region 12-1 and the second P− low concentration diffusion region 12-2. A sixth laminated structure body comprised of a sixth polysilicon layer 17-6 and a sixth metal layer 18-6 is formed over the second P+ high concentration diffusion region 13-2. When the structure of a high voltage semiconductor device in accordance with the first embodiment of the present invention is seen in a plan view, the second laminated structure body overlaps with the first N− low concentration diffusion region 10-1 and the second N− low concentration diffusion region 10-2, not with the first N+ high concentration diffusion region 11-1 and the second N+ high concentration diffusion region 11-2. By the same token, the fifth laminated structure body overlaps with the first P− low concentration diffusion region 12-1 and the second P− low concentration diffusion region 12-2, not with the first P+ high concentration diffusion region 13-1 and the second P+ high concentration diffusion region 13-2.

As shown in FIG. 9B, the resist pattern 27 is eliminated with a heretofore known method. As a result, a first source contact wiring layer 32-1 comprised of the first laminated structure body of the first polysilicon layer 17-1 and the metal layer 18-1 is formed over the first N+ high concentration diffusion region 11-1. A first gate electrode 31-1 comprised of the second laminated structure body of the second polysilicon layer 17-2 and the second metal film 18-2 is formed over the n-channel region. A first drain contact wiring layer 33-1 comprised of the third laminated body of the third polysilicon layer 17-3 and the third metal layer 18-3 is formed over the second N+ high concentration diffusion region 11-2. Furthermore, a second source contact wiring layer 32-2 comprised of the fourth laminated structure body of the fourth polysilicon layer 17-4 and the fourth metal layer 18-4 is formed over the first P+ high concentration diffusion region 13-1. A second gate electrode 31-2 comprised of the fifth laminated structure body of the fifth polysilicon layer 17-5 and the fifth metal layer 18-5 is formed over the p-channel region that is delimited between the first P− low concentration diffusion region 12-1 and the second P− low concentration diffusion region 12-2. A second drain contact wiring layer 33-2 comprised of the sixth laminated structure body of the sixth polysilicon layer 17-6 and the sixth metal layer 18-6 is formed over the second P+ high concentration diffusion region 13-2. When the structure of a high voltage semiconductor device in accordance with the first embodiment of the present invention is seen in a plan view, the first gate electrode 31-1 overlaps with the first N− low concentration diffusion region 10-1 and the second N− low concentration diffusion region 10-2, not with the first N+ high concentration diffusion region 11-1 and the second N+ high concentration diffusion region 11-2. By the same token, the second gate electrode 31-2 overlaps with the first P− low concentration diffusion region 12-1 and the second P– low concentration diffusion region 12-2, not with the first P+ high concentration diffusion region 13-1 and the second P+ high concentration diffusion region 13-2. This overlap structure alleviates the field effect.

An n-channel MOS transistor is formed on the p-type active region that is formed in the upper layer of the p-type single crystal silicon substrate 1 and is also surrounded by the p-type channel stopper 14. This n-channel MOS transistor is comprised of the n-type source region, the n-type drain region, the n-channel region that is delimited between the n-type source region and the n-type drain region, the first gate electrode 31-1 that is formed on the gate oxide film 16 and is also located over the n-channel region, the first gate electrode 31-1 that is formed on the gate oxide film 16 and is also located over the n-channel region, the first source contact wiring layer 32-1 that is in contact with the n-type source region, and the first drain contact wiring layer 33-1 that is in contact with the n-type drain region. As described above, the n-type source region is comprised of the first N– low concentration diffusion region 10-1 and the first N+ high concentration diffusion region 11-1. The n-type drain region is comprised of the second N– low concentration diffusion region 10-2 and the second N+ high concentration diffusion region 11-2. The first source contact wiring layer 32-1 is comprised of the first polysilicon layer 17-1 and the first metal layer 18-1. The first drain contact wiring layer 33-1 is comprised of the third polysilicon layer 17-3 and the third metal layer 18-3. The first gate electrode 31-1 is comprised of a laminated structure body of the second polysilicon layer 17-2 and the second metal layer 18-2.

A p-channel MOS transistor is formed on the n-type active region that is formed in an upper region of the n-type well 2 and is also surrounded by the n-type channel stopper 15. This p-channel MOS transistor is comprised of the p-type source region, the p-type drain region, the p-channel region that is delimited between the p-source region and the p-drain region, the second gate electrode 31-2 that is formed on the gate oxide film 16 and is also located over the p-channel region, the second source contact wiring layer 32-2 that is in contact with the p-type source region, and the second drain contact wiring layer 32-2 that is in contact with the p-type drain region. As described above, the p-type source region is comprised of the first P– low concentration diffusion region 12-1 and the first P+ high concentration diffusion region 13-1. The p-type drain region is comprised of second P– low concentration diffusion region 12-2 and the second P+ high concentration diffusion region 13-2. A second source contact wiring layer 32-2 is comprised of the fourth polysilicon layer 17-4 and the fourth metal layer 18-4. A second drain contact wiring layer 33-2 is comprised of the sixth polysilicon layer 17-6 and the sixth metal layer 18-6. The second gate electrode 31-2 is comprised of a laminated structure body of the fifth polysilicon layer 17-5 and the fifth metal layer 18-5.

The first gate electrode 31-1, the first source contact wiring layer 32-1, the first drain contact wiring layer 33-1, the second gate electrode 31-2, the second source contact wiring layer 32-2, and the second drain contact wiring layer 33-2 are simultaneously formed by patterning a laminated body of the polysilicon film 17 and the metal film 18. Therefore, the first gate electrode 31-1, the first source contact wiring layer 32-1, the first drain contact wiring layer 33-1, the second gate electrode 31-2, the second source contact wiring layer 32-2, and the second drain contact wiring layer 33-2 have the same laminated structure. Here, the first to sixth polysilicon layers 17-1 to 17-6 are formed in substantially the same thickness. Furthermore, first to sixth metal layers 18-1 to 18-6 are formed in substantially the same thickness.

As shown in FIG. 9C, a passivation film 19 comprised of a silicon nitride film is formed on the gate insulating film 16 with a heretofore known plasma CVD. Also, the passivation film 19 is formed to fully bury the above described n-channel MOS transistor and p-channel MOS transistor. Thus, the semiconductor device in accordance with the present invention is formed.

As described above, the polysilicon 17 is formed on the gate oxide film 16. The source/drain contacts are formed in the laminated body of the gate oxide film 16 and the polysilicon film 17. Then, the metal film 18 is formed on the polysilicon film 17 and in the interior of the source/drain contacts, and thus a laminated body comprised of the polysilicon film 17 and the metal film 18 is formed. Next, the gate electrode and the source/drain contact wiring layers, each of which are comprised of a laminated structure body of the polysilicon layer and the metal layer, are simultaneously formed by patterning this laminated body. Furthermore, the channel stopper and the high concentration diffusion region are simultaneously formed instead of forming a field oxide film. Therefore, the present embodiment of the present invention has following effects.

First, the MOS transistor in accordance with the present invention includes source/drain contact wiring layers, which are comprised of the polysilicon layer and the metal layer, and a gate electrode, which is comprised of the same dual structure of the source/drain contact wiring layers. Therefore, the work function of the gate electrode comprised of the gate electrode of the polysilicon layer and the metal layer is higher than that of the gate electrode consisting only of polysilicon. This enables the MOS transistor to have desired high performance and to maintain desired high reliability.

Second, the wiring film is formed with the dual layer structure of the polysilicon film and the metal film. Here, the polysilicon film is in direct contact with the insulating film. On the other hand, the metal film is separated from the insulating film across the polysilicon film. Because of this, degradation of the insulating film is not caused by deposits included in spikes or metal wirings.

Third, the source/drain contact wiring layers and the gate electrode are formed in the same process as the method of forming a MOS transistor in accordance with the present invention. Therefore, the number of processes for forming a mask comprised of a resist pattern is less than that when forming source/drain contact wiring layers and the gate electrode in different processes.

Fourth, the MOS transistor in accordance with the present invention has a channel stopper in order to separate elements. In other words, the method for manufacturing a semiconductor device in accordance with the present invention does not have to include a process for forming a field oxide film after the LOCOS process. Therefore, the number of forming a mask comprised of a resist pattern is less than that in forming a field oxide film after the LOCOS process.

Other Embodiments

In the first embodiment of the present invention, the first P– low concentration impurity implantation region 5-1 and the second P– low concentration impurity implantation region 5-2 are formed after the first N– low concentration impurity implantation region 4-1 and the second N– low concentration impurity implantation region 4-2 are formed. However, in the other embodiment, the first P– low concentration impurity implantation region 5-1 and the second P– low concentration impurity implantation region 5-2 may be formed before the first N− low concentration impurity implantation region 4-1 and the second N− low concentration impurity implantation region 4-2 are formed.

Also in the first embodiment of the present invention, the first P+ high concentration impurity implantation region 8-1 and the second P+ high concentration impurity implantation region 8-2 are formed after the first N+ high concentration impurity implantation region 6-1 and the second N+ high concentration impurity implantation region 6-2 are formed. However, in the other embodiment, the first P+ high concentration impurity implantation region 8-1 and the second P+ high concentration impurity implantation region 8-2 may be formed before the first N+ high concentration impurity implantation region 6-1 and the second N+ high concentration impurity implantation region 6-2 are formed.

Furthermore, in the other embodiment, ion implantation can be conducted with respect to the n-channel region and the p-channel region, respectively, in order to control the threshold voltage right before the process of eliminating the silicon dioxide film 3.

Also, in the other embodiment, a semiconductor device can include a multilayer wiring structure. In this case, an interlayer isolating film can be formed instead of forming the passivation film.

Also, in the first embodiment of the present invention, n-channel MOS transistor is formed in the p-type single crystal silicon substrate 1, and the p-channel MOS transistor is formed in the n-type well 2. However, in the other embodiment, the p-type well may be selectively formed in n-type single crystal silicon substrate and the p-channel MOS transistor may be formed in the n-type single crystal silicon substrate, and n-channel MOS transistor may be formed in the p-type well. Also, in the other embodiment, the n-type well and the p-type well may be formed in a silicon substrate, and the p-channel MOS transistor may be formed in a n-type well, and the n-channel MOS transistor may be formed in the p-type well.

Also, in the first embodiment of the present invention, the semiconductor device including the MOS transistor that has the gate electrode formed on the gate insulating film is manufactured. In the other embodiment, the present invention can be applied to a method for manufacturing a semiconductor device including a MOS transistor that has a floating gate electrode formed on the gate insulating film. In this case, the floating gate electrode and source/drain contact wiring layers can be simultaneously formed by pattering a laminated body comprised of a polysilicon film 17 and the metal film 18.

In the present invention, it should be understood that the above mentioned ion implantation means a process of implanting ions into the surface of the substrate in a vertical direction.

Also, it should be understood that the above mentioned thickness and impurity concentration of each film are just examples and can be changed.

This application claims priority to Japanese Patent Application No. 2005-067154. The entire disclosure of Japanese Patent Application No. 2005-067154 is hereby incorporated herein by reference.

The terms of degree such as "substantially" used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device, comprising the steps of:
   (a) forming a first region and a channel stopper in an upper region of a semiconductor substrate by:
      (1) selectively forming a first impurity implantation region with a first impurity concentration in the upper region of the semiconductor substrate by selectively implanting ions in the upper region of the semiconductor substrate;
      (2) selectively forming a second impurity implantation region with a second impurity concentration which is greater than the first impurity concentration in the upper region of the semiconductor substrate by selectively implanting ions in the upper region of the semiconductor substrate; and
      (3) simultaneously forming by thermal diffusion treatment a first impurity diffusion region with a third impurity concentration and a second impurity diffusion region with a fourth impurity concentration which is greater than the third impurity concentration in the first region, and a third impurity diffusion region with fifth impurity concentration which is greater than the third impurity concentration in the channel stopper;
   (b) forming a first insulating film over the semiconductor substrate;
   (c) forming a laminated body on the first insulating film by (1) forming a polysilicon film on the first insulating film; (2) forming a contact hole that is in contact with the first region on the semiconductor substrate through the first insulating film and the polysilicon film; and (3) forming a metal film on the polysilicon film and in the contact hole so that the metal film is separated from the first insulating film by means of the polysilicon film; and
   (d) forming a first wiring layer and a first electrode simultaneously by patterning the laminated body.

2. The method according to claim 1, further comprising the steps of:
   forming a first oxide film on a surface of the semiconductor substrate by oxidizing a surface of the semiconductor substrate before the step of forming the first region and the channel stopper; and
   eliminating the first oxide film after the step of forming the first region and the channel stopper and before the step of forming the first insulating film.

3. The method according to claim 1, wherein said first insulating film is a gate insulating film.

4. The method according to claim 1, wherein said first electrode is a gate electrode.

5. The method according to claim 1, wherein said first electrode is a floating gate.

6. The method according to claim 1, wherein the first region is comprised of either or both of a source region and a drain region.

7. The method according to claim 1, wherein said semiconductor device includes a field-effect transistor.

8. The method according to claim 7, wherein the first electrode is a floating gate electrode.

9. A method for manufacturing a semiconductor device, comprising the steps of:
- (a) forming a first region and a channel stopper in an upper region of a semiconductor substrate by:
  - (1) selectively forming a first impurity implantation region with a first impurity concentration in the upper region of the semiconductor substrate by selectively implanting ions in the upper region of the semiconductor substrate;
  - (2) selectively forming a second impurity implantation region with a second impurity concentration which is greater than the first impurity concentration in the upper region of the semiconductor substrate by selectively implanting ions in the upper region of the semiconductor substrate; and
  - (3) simultaneously forming by thermal diffusion treatment a first impurity diffusion region with a third impurity concentration and a second impurity diffusion region with a fourth impurity concentration which is greater than the third impurity concentration in the first region, and a third impurity diffusion region with fifth impurity concentration which is greater than the third impurity concentration in the channel stopper;
- (b) forming a first insulating film over the semiconductor substrate;
- (c) forming a laminated body on the first insulating film by forming a polysilicon film on the first insulating film;
- (c) forming a contact hole that is in contact with the first region on the semiconductor substrate through the first insulating film and the polysilicon film; and
- (d) forming a metal film on the polysilicon film and in the contact hole; and
- (e) forming a first wiring layer and a first electrode simultaneously by patterning the laminated body.

10. The method according to claim 9, further comprising the steps of:
forming a first oxide film on a surface of the semiconductor substrate by oxidizing a surface of the semiconductor substrate before the step of forming the first region and the channel stopper; and
eliminating the first oxide film after the step of forming the first region and the channel stopper and before the step of forming the first insulating film.

11. A method for manufacturing a semiconductor device, comprising the steps of:
- (a) forming at least one of a source region and a drain region, and a channel stopper, in an upper region of a semiconductor substrate by:
  - (1) selectively forming a first impurity implantation region with a first impurity concentration in the upper region of the semiconductor substrate by selectively implanting ions in the upper region of the semiconductor substrate;
  - (2) selectively forming a second impurity implantation region with a second impurity concentration which is greater than the first impurity concentration in the upper region of the semiconductor substrate by selectively implanting ions in the upper region of the semiconductor substrate; and
  - (3) simultaneously forming by thermal diffusion treatment a first impurity diffusion region with a third impurity concentration and a second impurity diffusion region with a fourth impurity concentration which is greater than the third impurity concentration in the at least one of a source region and a drain region, and a third impurity diffusion region with fifth impurity concentration which is greater than the third impurity concentration in the channel stopper;
- (b) forming a first insulating film over the semiconductor substrate;
- (c) forming a laminated body on the first insulating film that includes a polysilicon film and a metal film that is separated from the insulating film by means of the polysilicon film by:
  - (1) forming the polysilicon film on the first insulating film;
  - (2) forming a contact hole that is in contact with the at least one of a source region and a drain region on the semiconductor substrate through the first insulating film and the polysilicon film; and
  - (3) forming the metal film on the polysilicon film and in the contact hole; and
- (d) forming a first wiring layer and a first electrode simultaneously by patterning the laminated body.

12. The method according to claim 11, further comprising the steps of:
forming a first oxide film on a surface of the semiconductor substrate by oxidizing a surface of the semiconductor substrate before the step of forming the at least one of a source region and a drain region and the channel stopper; and
eliminating the first oxide film after the step of forming the at least one of a source region and a drain region and the channel stopper, and before the step of forming the first insulating film.

* * * * *